United States Patent
Mehnert

(10) Patent No.: US 10,566,512 B2
(45) Date of Patent: Feb. 18, 2020

(54) LED METAL PAD CONFIGURATION FOR OPTIMIZED THERMAL RESISTANCE

(71) Applicant: Lumileds LLC, San Jose, CA (US)

(72) Inventor: Axel Mehnert, Mountain View, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/780,100

(22) PCT Filed: Nov. 23, 2016

(86) PCT No.: PCT/US2016/063673
§ 371 (c)(1),
(2) Date: May 30, 2018

(87) PCT Pub. No.: WO2017/095712
PCT Pub. Date: Jun. 8, 2017

(65) Prior Publication Data
US 2018/0358527 A1    Dec. 13, 2018

Related U.S. Application Data

(60) Provisional application No. 62/262,311, filed on Dec. 2, 2015.

(51) Int. Cl.
*H01L 33/64*    (2010.01)
*H01L 33/62*    (2010.01)
(Continued)

(52) U.S. Cl.
CPC ............ *H01L 33/642* (2013.01); *H01L 33/62* (2013.01); *H01L 33/647* (2013.01);
(Continued)

(58) Field of Classification Search
CPC ..... H01L 33/642; H01L 33/62; H01L 33/647; H01L 33/38
See application file for complete search history.

(56) References Cited

U.S. PATENT DOCUMENTS 5,757,620 A * 5/1998 Edwards ................. H01L 23/42
165/185
6,573,537 B1    6/2003 Steigerwald et al.
(Continued)

FOREIGN PATENT DOCUMENTS

JP    2013-149683    8/2013
WO    2013/175333    11/2013
WO    2015/101899    7/2015

*Primary Examiner* — Ida M Soward
(74) *Attorney, Agent, or Firm* — Volpe and Koenig, P.C.

(57) ABSTRACT

An electronic device is described. The electronic device includes a body having a first surface and a second surface opposite the first surface. The first surface of the body is a first surface of the electronic the device. The electronic device also has a second surface opposite the first surface. A metal pattern is disposed on the second surface of the electronic device. The metal pattern includes a first electrode, a second electrode, and at least two thermal pads. The at least two thermal pads are electrically isolated from the first electrode and the second electrode, are located along opposite sides of the second surface of the electronic device, and have substantially identical shapes.

12 Claims, 2 Drawing Sheets

(51) Int. Cl.
*H01L 33/38* (2010.01)
*F21Y 115/10* (2016.01)

(52) U.S. Cl.
CPC .......... *F21Y 2115/10* (2016.08); *H01L 33/38* (2013.01); *H01L 2933/0075* (2013.01); *H05K 2201/10106* (2013.01)

(56) References Cited

U.S. PATENT DOCUMENTS

| | | | |
|---|---|---|---|
| 7,834,375 B2 * | 11/2010 | Andrews | H01L 33/52 257/100 |
| 8,378,372 B2 * | 2/2013 | Wang | H01L 23/3677 257/98 |
| 8,772,798 B2 * | 7/2014 | Seibel | H01L 25/0753 257/89 |
| 9,583,691 B2 * | 2/2017 | Tischler | H01L 33/642 |
| 10,204,887 B2 * | 2/2019 | Rong | H01L 33/60 |
| 2008/0054450 A1 * | 3/2008 | Chiu | H01L 23/367 257/717 |
| 2011/0254028 A1 * | 10/2011 | Pei | H01L 25/0753 257/91 |
| 2012/0007117 A1 * | 1/2012 | Andrews | B23K 1/0016 257/98 |
| 2012/0161190 A1 | 6/2012 | Yao | |
| 2013/0087813 A1 | 4/2013 | Yan et al. | |
| 2013/0299960 A1 | 11/2013 | Chan | |
| 2014/0111990 A1 | 4/2014 | Schupple et al. | |
| 2014/0254180 A1 | 9/2014 | Yeh et al. | |
| 2016/0131340 A1 * | 5/2016 | Zanon | F41V 19/0025 362/382 |
| 2018/0366451 A1 * | 12/2018 | Shimizu | H01L 33/486 |

* cited by examiner

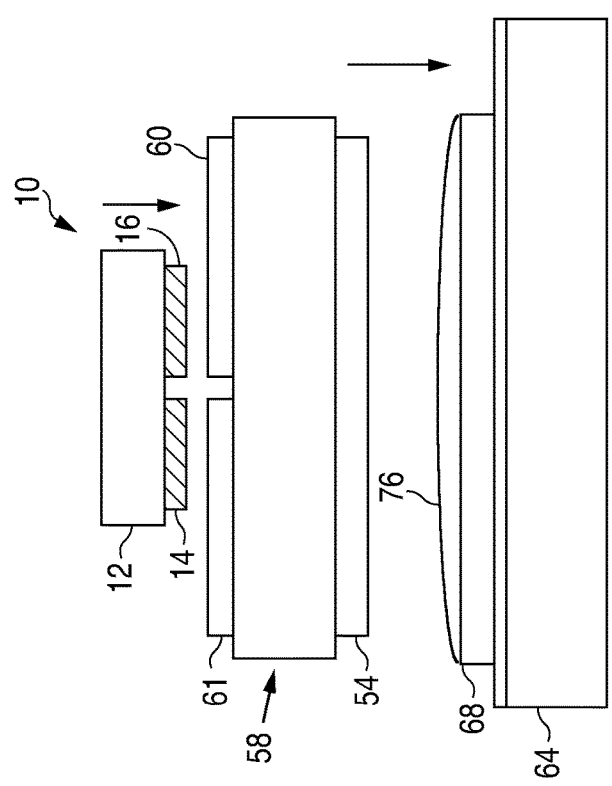
FIG. 5B
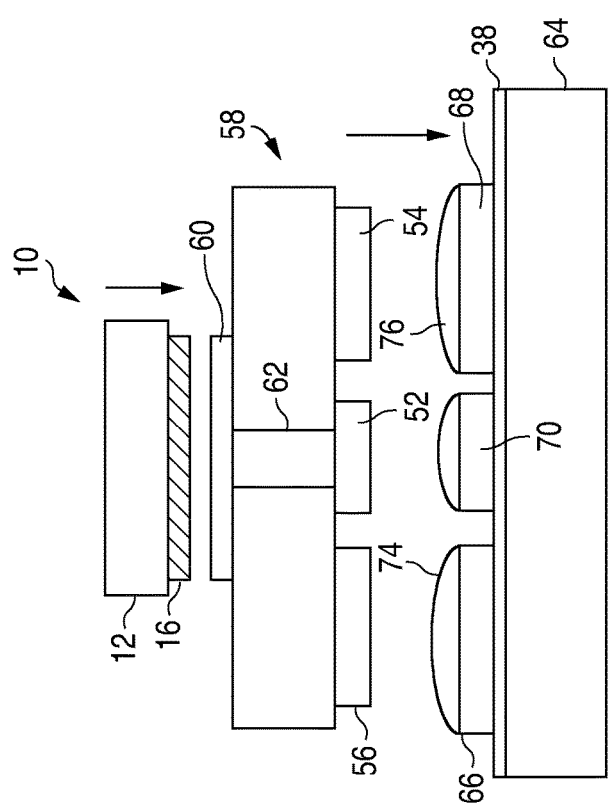
FIG. 5A
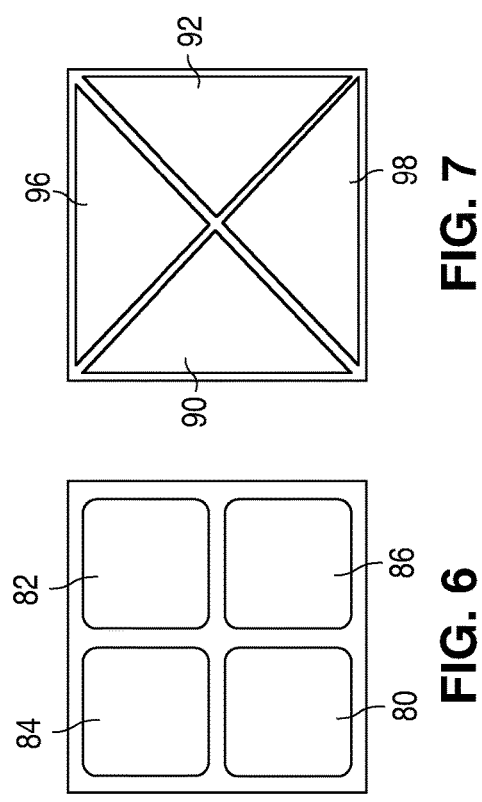
FIG. 8
FIG. 7
FIG. 6

LED METAL PAD CONFIGURATION FOR OPTIMIZED THERMAL RESISTANCE

CROSS-REFERENCE TO RELATED APPLICATIONS

The present application claims priority to U.S. Provisional Patent Application No. 62/262,311 titled, "LED METAL PAD CONFIGURATION FOR OPTIMIZED THERMAL RESISTANCE, SOLDER RELIABILITY, AND SMT PROCESSING YIELDS", filed Dec. 2, 2015. U.S. Provisional Patent Application No. 62/262,311 is incorporated herein.

FIELD OF THE INVENTION

This invention relates to an electronic device and, in particular, to a configuration of metal pads on a surface of a semiconductor die or submount that are soldered to pads of a circuit board for improved thermal resistance, solder reliability, and surface mount technology (SMT) processing yields.

BACKGROUND

FIG. 1 illustrates a conventional LED die 10. The LED die 10 includes semiconductor layers and, optionally, a transparent substrate, represented by the LED layers 12. The bottom cathode electrode 14 is electrically connected to the n-type layers in the LED die 10, and the anode electrode 16 is connected to the p-type layers in the LED die 10. Although the LED die 10 is shown as a flip-chip, it may instead have one wire-bonded top electrode or two wire-bonded top electrodes.

The LED die 10 can initially be mounted on a thermally conductive submount 18, such as having an AlN body. Using a submount greatly eases handling of the LED die 10 and mounting on a circuit board. The submount 18 has top metal pads 20 and 22 that are bonded to the LED die electrodes 14 and 16 via ultrasonic welding or other technique. The submount's metal pads 20 and 22 are electrically connected to bottom electrodes 24 (only one is shown in the cross-section) by means of metal traces on the top surface of the submount 18 and vertical vias 26 extending through the submount body.

The submount 18 acts like an interface between the LED die 10 and the printed circuit board 30 for conducting electrical current and the heat generated by the LED die 10. The heat generated by the LED die 10 is primarily conducted to the submount body by the LED die electrodes 14 and 16, and the submount 18 conducts the heat to the circuit board 30 via an electrically insulated thermal pad 32, usually formed of copper. Electrodes 34 (only one is shown in the cross-section) on the circuit board 30 are soldered to the bottom electrodes 24 of the submount 18, and the thermal pad 35 on the circuit board 30 is soldered to the thermal pad 32 on the submount 18. The electrodes 34 are connected by traces 36 to a power source. The circuit board 30 is often highly thermally conductive, such as formed of an aluminum or copper core with a thin dielectric layer 38 to electrically insulate the electrodes 34 and traces 36 from the metal core.

The thermal pad 35 on the circuit board 30 may be much larger than the footprint of the submount 18 to spread the heat laterally.

FIG. 2 illustrates the electrodes 24A and 24B and thermal pad 32 on the bottom surface of the submount 18, which correspond to the electrode and thermal pad pattern on the circuit board 30.

Problems with such a design are that the heat spreading within the Cu layer of the circuit board 30 is partially choked by the location of the electrodes 34, since the thermal flow is interrupted by the gap between thermal and electrical pads. Another problem is that the molten solder 40 (such as from a solder bath) that wets over the thermal pad 35 is not flat due to surface tension, and the height of the molten solder 42 on the smaller electrodes 34 is different from the height of the solder 40 over the thermal pad 35. This results in the submount 18 and LED die 10 being slightly tilted when mounted over the circuit board 30 after the solder is solidified by cooling. This effect comes especially into play for larger submounts, such as larger than 2.5×2.5 mm.

Further, in the design of FIGS. 1 and 2, solder cracks and delamination, resulting from a mismatch in the coefficient of thermal expansion (CTE) between the submount 18 and the circuit board 30, are more likely to occur because the stresses increase with distance from the center of the submount 18, and the small electrodes 24 are furthest from the center of the submount 18. If the electrodes are not adequately electrically connected together by the solder, arcing can occur for a cracked open contact, high heat can be generated at the interface, and there will be an increased voltage drop.

The same issues occur if the bottom surface of the LED die 10 had an electrode and thermal pad configuration similar to that shown in FIG. 2, and the LED die 10 were directly bonded to corresponding pads on a circuit board.

FIG. 3 illustrates another conventional configuration of electrodes 44 and 46 and a thermal pad 48 on the bottom surface of a submount for an LED die. This 3-stripe design has drawbacks for tilting, choking of heat spreading by the electrodes 44/46, and solder cracking/delamination that are similar to those described above for the configuration of FIG. 2, since the electrodes 44 and 46 are away from the center and partially surround the thermal pad 48.

What is needed is a metal electrode and thermal pad configuration on the bottom surface of an LED die or submount that does not suffer from the drawbacks described above.

SUMMARY

Various metal electrode and thermal pad configurations on the bottom surface of a semiconductor die or submount are described that improve the thermal and electrical characteristics of an electronic or opto-electronic device.

In one embodiment, the cathode and anode electrodes of an LED module are located along a center-line of the submount bottom surface, and two thermal pads are located on opposite sides of the bottom surface with the electrodes between the two thermal pads. Since the stresses on the solder are lowest near the middle of the submount, there is less stress on solder bonding the electrodes to the circuit board.

Further, since the heat conducted by the two thermal pads is not choked by the electrodes, the heat spreads more uniformly into the circuit board and outwardly.

Further, since the metal design is symmetrical and the thermal pads are identical, the molten solder will have the same shape over both the thermal pads, causing the die and submount to be parallel to the surface of the circuit board. Therefore, there is no tilting of the die. This is particularly valuable when the die is an LED die, since the tilting affects the light emission profile.

Other configurations are described where the various metal electrodes and thermal pads on the bottom of a die or submount are arranged to achieve the thermal and electrical improvements described above.

BRIEF DESCRIPTION OF THE DRAWINGS

FIG. 5A is a cross-sectional view of an LED die being mounted on a submount, which is being mounted on a circuit board, where the bottom surface of the submount has the metal configuration shown in FIG. 4, and where the view faces the short sides of the thermal pads.

FIG. 5B illustrates the structure of FIG. 5A where the view faces the long side of a thermal pad.

FIG. 6 illustrates the metal electrode and thermal pad configuration on the bottom of an LED die or submount in accordance with another embodiment of the invention.

FIG. 7 illustrates the metal electrode and thermal pad configuration on the bottom of an LED die or submount in accordance with another embodiment of the invention.

FIG. 8 illustrates a submount on which multiple dies are mounted, where the submount has a bottom metal pattern similar to the metal patterns of FIG. 4, 6, or 7.

Elements that are the same or equivalent in the various figures are labeled with the same numeral.

DETAILED DESCRIPTION

Although the invention is applicable to any electronic device having metal pads that are to be bonded to a circuit board, an example will be described of an LED module.

Figure 4:
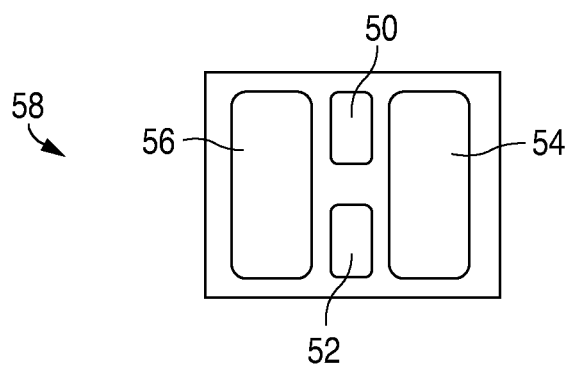
FIG. 4 illustrates the metal electrode and thermal pad configuration on the bottom of an LED die or submount in accordance with one embodiment of the invention.

FIG. 4 is a view of the bottom surface of an exemplary LED die or submount showing the metal cathode electrode 50, anode electrode 52, and thermal pads 54 and 56, in accordance with one embodiment of the invention. In the example, it is assumed the LED die is mounted on a submount, and the submount is to be mounted on a circuit board, having the same metal pattern. Therefore, the configuration shown in FIG. 4 is that on the bottom surface of a submount 58. The metal electrode configuration on the bottom of the LED die is therefore not relevant since the submount 58 electrically connects the LED die electrodes to the bottom electrodes 50/52 on the submount 58 using traces and vertical vias, and the heat generated by the LED die is conducted by the submount body to the thermal pads 54/56.

In another embodiment, the LED die may also include thermal pads, and the submount may include metal vias leading from top thermal pads to the bottom thermal pads 54 and 56.

Figure 1:
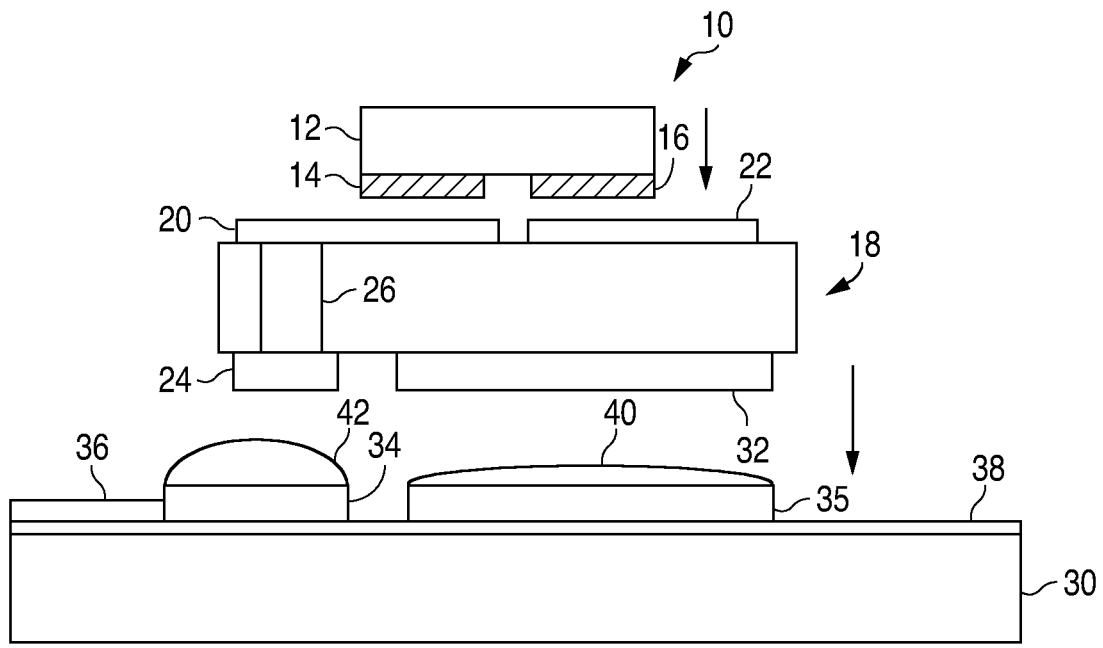
FIG. 1 is a cross-sectional view of an exemplary LED die being mounted on a submount, which is being mounted on a circuit board, where the metal pattern on the bottom surface of the submount is shown in FIG. 2.
Figure 2:
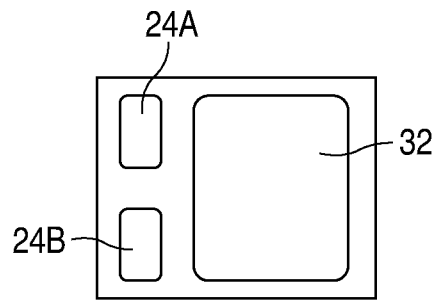
FIG. 2 illustrates a conventional metal electrode and thermal pad configuration on the bottom of a conventional LED die or submount.
Figure 3:
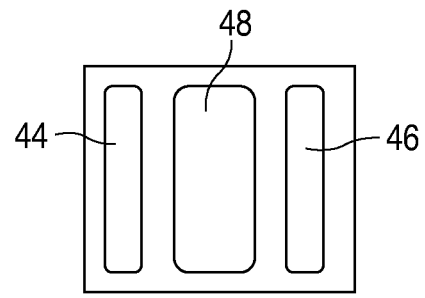
FIG. 3 illustrates another conventional metal electrode and thermal pad configuration on the bottom of a conventional LED die or submount.

FIG. 5A illustrates an LED die 10, which may be the conventional LED die in FIG. 1, being mounted on the top surface of the submount 58. The view is facing the short sides of the thermal pads 54 and 56. FIG. 5B illustrates the structure of FIG. 5A where the view faces the long side of the thermal pad 54.

The LED die's anode electrode 16 is shown being attached to a top metal anode pad 60 on the submount 58, and the cathode electrode 14 is shown being attached to a top metal cathode pad 61 on the submount 58, such as by ultrasonic welding or other technique. The pad 60 is electrically connected to the bottom anode electrode 52 by a vertical metal via 62 formed in the submount body. The view from the opposite side showing the LED die's cathode electrode 14 is identical to FIG. 5A.

The heat from the LED die 10 is conducted from the LED die's bottom surface, including from the LED die's metal electrodes 14/16, to the body of the submount 58 to initially spread the heat throughout the submount 58. The heat is then transferred to the metal core circuit board 64 via the thermal pads 54 and 56 on the submount 58 and the corresponding metal pads 66 and 68 on the circuit board 64. The anode electrode 52 of the submount 58 is electrically connected to the anode pad 70 on the circuit board 64. The pads 66 and 68 on the circuit board 64 may extend beyond the footprint of the submount 58 for better heat spreading since there are no electrodes blocking the outward expansion of the pads 66 and 68.

The metal configuration shown in FIG. 4 improves heat sinking from the LED die 10, reduces tilting of the LED die, and reduces the likelihood of solder cracking/delamination as discussed below.

Since the thermal pads 54 and 56 are symmetrically located near both sides of the submount 58, with the electrodes 50 and 52 along the middle, there is no choking of the outward heat spreading after the submount 58 is mounted on the circuit board 64. Further, the configuration allows the thermal pads 66 and 68 on the circuit board 64 to extend beyond the footprint of the submount 58 to better spread heat.

Since the sizes of the thermal pads 66 and 68 are the same and extend virtually the entire length of the submount 58, the molten solder 74 and 76 dispensed on both pads 66 and 68 have the same characteristics, such as height and volume. Therefore, when the submount 58 is placed over the molten solder, the submount 58 and LED die 10 will not be tilted. When the solder is cooled, the metal pads 66/68/70 on the circuit board 64 will be thermally and electrically connected to the respective electrodes 50/52 and thermal pads 54/56 on the submount 58.

Due to inherent CTE mismatches between the submount 58 and the circuit board 64, the solder joints will undergo stress due to thermal cycling. The stresses are greater further from the center of the submount 58. Since the solder joints connected to the "center" electrodes 50 and 52 have a smaller area than the solder joints connected to the thermal pads 54 and 56, they are more susceptible to cracking/delamination, which reduces the reliability of the electrical connection to the LED die. These electrode solder joints undergo less stress than the thermal pad solder joints since they are closer to the center of the submount 58. Thus, the configuration improves the reliability of the solder joints.

The same concept of providing more symmetry of the pad configuration and not choking the heat distribution from the thermal pads can be applied to different metal designs on a surface of the submount or LED die.

FIG. 6 illustrates another embodiment of the metal electrode and thermal pad configuration on the bottom surface of a submount or LED die. The cathode electrode 80, anode electrode 82, thermal pad 84, and thermal pad 86 are rectangular (e.g., square) and located in different quadrants. There is a corresponding pattern on the circuit board. Since all the electrodes/pads are the same size, the molten solder has the same height on each electrode/pad so that there is no tilting.

Since the thermal pads 84 and 86 are not blocked by electrodes on two of their outer sides, the heat can spread more efficiently into the circuit board, and the circuit board may use thermal pads that extend well beyond the footprint of the submount.

Since the electrodes 80 and 82 are close to the middle of the submount, there will be less thermal stress on the solder joints to reduce the likelihood of cracking or delamination.

FIG. 7 illustrates another embodiment of the metal electrode and thermal pad configuration on the bottom surface of a submount or LED die. The cathode electrode 90, anode electrode 92, thermal pad 96, and thermal pad 98 are triangular and located in different quadrants. The circuit board has a corresponding metal pattern. Since all the electrodes/pads are the same size, the molten solder has the same height on each electrode/pad so that there is no tilting.

Since the thermal pads 96 and 98 are not blocked by electrodes on their outer sides, the heat can spread more efficiently into the circuit board, and the circuit board may use thermal pads that extend well beyond the footprint of the submount.

Since the electrodes 90 and 92 are close to the middle of the submount, there will be less thermal stress on the solder joints to reduce the likelihood of cracking or delamination.

Other metal pattern configurations are possible using the guidelines describe above in connection with FIGS. 4-7. For example, the thermal pads may be more than two and symmetrically surround electrodes closer to the center of the submount. The thermal pads can be any shape.

As seen, an LED metal pad configuration has been described that optimizes thermal resistance between the LED and circuit board (i.e., on a system level), improves solder reliability, and increases the SMT processing yield (i.e., successful bonding to the circuit board).

Since the metal pattern is useful on either the bottom of an LED die or its submount, whichever is directly mounted to the surface of a substrate, such as a circuit board, either structure can be referred to as an LED module. The LED die may be a laser diode die or a non-lasing die.

FIG. 8 illustrates a submount 102 having a bottom metal pattern consistent with any of the above-described metal patterns for bonding to a circuit board. Multiple dies 104 and 106, representing any number of dies, may be interconnected by a trace pattern on the top of the submount 102. The combined heat generated by the dies 104 and 106 is transferred to the circuit board via the thermal pads on the bottom of the submount 102. In one embodiment, any number of electrodes for the dies 104 and 106 may be located between the thermal pads on the bottom of the submount 102 consistent with the concept of FIG. 4. In another embodiment, the electrodes may be distributed along with the thermal pads in the manner identified in FIGS. 6 and 7.

By placing all electrodes near the center of the submount and the thermal pads on both sides of the electrodes or around all the electrodes, there is less thermal (CTE) stress on the electrodes (since the electrodes are close to the center) so as to increase the solder bond reliability, while reducing the likelihood of tilting. With larger submounts, such as those that support multiple LED dies (or other heat-generating dies), the problems with thermal stress are increased so the present invention is particularly beneficial for the larger submounts.

The metal pattern designs are beneficial for any die and/or submount where heat is generated and is not limited to LEDs. For example, power transistors and other high-heat producing dies can benefit from the present invention.

While particular embodiments of the present invention have been shown and described, it will be obvious to those skilled in the art that changes and modifications may be made without departing from this invention in its broader aspects and, therefore, the appended claims are to encompass within their scope all such changes and modifications.

The invention claimed is:

1. An electronic device comprising:
  a body having a first surface and a second surface opposite the first surface, the first surface being a first surface of the electronic device, the electronic device having a second surface opposite the first surface; and
  a metal pattern disposed on the second surface of the electronic device, the metal pattern comprising:
    a first electrode,
    a second electrode, and
    at least two thermal pads, electrically isolated from the first electrode and second electrode, the at least two thermal pads being located along opposite sides of the second surface of the electronic device and having substantially identical shapes.

2. The electronic device of claim 1, wherein: the second surface of the electronic device is a surface of the body that is opposite the first surface of the body, and the first electrode, the second electrode and the at least two thermal pads are directly coupled to the second surface of the body.

3. The electronic device of claim 1, wherein: the body is a semiconductor die that is mounted on a first surface of a submount, and the second surface of the electronic device is a second surface of the submount that is opposite the first surface of the submount.

4. The electronic device of claim 1, wherein: the body is a semiconductor die, and the second surface of the electronic device is second surface of the body.

5. The electronic device of claim 1, wherein: the body comprises a plurality of dies mounted on a first surface of a submount, and the second surface of the electronic device is a second surface of the submount that is opposite the first surface of the submount.

6. The electronic device of claim 1, wherein: the first electrode and the second electrode are located along a center line of the second surface of the electronic device, and the thermal pads are each located on opposite sides of the center line.

7. The electronic device of claim 1, wherein each of the thermal pads is larger than each of the first electrode and second electrode.

8. The electronic device of claim 1, wherein: the thermal pads are rectangular and are located diagonal from one another on opposite sides of a center line of the second surface of the electronic device, and the first electrode and second electrode are rectangular and located diagonal from one another on opposite sides of the center line in different locations than the thermal pads.

9. The electronic device of claim 1, wherein: the thermal pads are triangular and are located opposite one another on opposite sides of a first center line of the second surface of the electronic device, and the first electrode and second electrode are triangular and located opposite one another on opposite sides of a second center line of the second surface of the electronic device that crosses the first center line.

10. The electronic device of claim 1, wherein the body further comprises a transparent substrate.

11. The electronic device of claim 1, wherein each of the thermal pads has a surface area larger than a surface area of each of the cathode electrode and the anode electrode.

12. The electronic device of claim 1, wherein surface areas of each of the thermal pads, the cathode electrode and the anode electrode are equal.

* * * * *